(12) United States Patent
Son et al.

(10) Patent No.: US 10,714,265 B2
(45) Date of Patent: Jul. 14, 2020

(54) LAMINATED ELECTRONIC COMPONENT AND CIRCUIT BOARD FOR MOUNTING THE SAME

(71) Applicant: SAMSUNG ELECTRO-MECHANICS CO., LTD., Suwon-si, Gyeonggi-do (KR)

(72) Inventors: Soo Hwan Son, Suwon-si (KR); Seung Hyun Ra, Suwon-si (KR); Kyoung Jin Jun, Suwon-si (KR); Sang Soo Park, Suwon-si (KR); Young Key Kim, Suwon-si (KR); Soon Ju Lee, Suwon-si (KR)

(73) Assignees: HYUNDAI MOTOR COMPANY, Seoul (KR); KIA MOTORS CORPORATION, Seoul (KR)

( * ) Notice: Subject to any disclaimer, the term of this patent is extended or adjusted under 35 U.S.C. 154(b) by 0 days.

(21) Appl. No.: 16/267,678

(22) Filed: Feb. 5, 2019

(65) Prior Publication Data

US 2019/0172651 A1 Jun. 6, 2019

Related U.S. Application Data

(63) Continuation of application No. 15/065,521, filed on Mar. 9, 2016, now abandoned.

(30) Foreign Application Priority Data

Jul. 6, 2015 (KR) ........................ 10-2015-0096169

(51) Int. Cl.
*H01G 4/38* (2006.01)
*H01G 4/012* (2006.01)
(Continued)

(52) U.S. Cl.
CPC ............... *H01G 4/38* (2013.01); *H01G 2/065* (2013.01); *H01G 4/012* (2013.01); *H01G 4/232* (2013.01);
(Continued)

(58) Field of Classification Search
CPC ....................................... H01G 4/38
(Continued)

(56) References Cited

U.S. PATENT DOCUMENTS 6,989,995 B2 1/2006 Ito
2001/0007522 A1* 7/2001 Nakagawa ............... H01G 4/38
361/301.4

(Continued)

FOREIGN PATENT DOCUMENTS

JP 11-329892 A 11/1999
JP 2009-065198 A 3/2009
(Continued)

OTHER PUBLICATIONS

U.S. Final Office Action dated Nov. 8, 2018 issued in U.S Appl. No. 15/065,521.
(Continued)

*Primary Examiner* — Stanley Tso
(74) *Attorney, Agent, or Firm* — Morgan, Lewis & Bockius LLP

(57) ABSTRACT

A laminated electronic component includes a first capacitor including a first ceramic body, first external electrodes disposed on upper and lower surfaces of the first ceramic body, and second external electrodes disposed apart from the first external electrodes on the upper and lower surfaces of the first ceramic body, and a second capacitor including a second ceramic body, a third external electrode disposed on a lower surface of the second ceramic body, and a fourth external electrode disposed apart from the third external
(Continued)

electrode on the lower surface of the second ceramic body, and disposed on the first capacitor and electrically connected to the first capacitor. A current loop passing through the upper surface of the first ceramic body and the lower surface of the second ceramic body is formed.

19 Claims, 8 Drawing Sheets

(51) Int. Cl.
    *H01G 4/30* (2006.01)
    *H05K 1/18* (2006.01)
    *H05K 1/11* (2006.01)
    *H01G 2/06* (2006.01)
    *H01G 4/232* (2006.01)
    *H01G 4/12* (2006.01)

(52) U.S. Cl.
    CPC .............. *H01G 4/30* (2013.01); *H05K 1/117* (2013.01); *H05K 1/181* (2013.01); *H01G 4/12* (2013.01); *H05K 2201/10015* (2013.01)

(58) Field of Classification Search
    USPC ........................................................ 174/260
    See application file for complete search history.

(56) References Cited

U.S. PATENT DOCUMENTS

| | | |
|---|---|---|
| 2004/0085742 A1 | 5/2004 | Ito |
| 2008/0186652 A1 | 8/2008 | Lee et al. |
| 2009/0086403 A1* | 4/2009 | Lee ..................... H01G 4/012 361/301.4 |
| 2010/0053842 A1 | 3/2010 | Devoe |
| 2011/0043963 A1 | 2/2011 | Bultitude |
| 2012/0039014 A1 | 2/2012 | Ogawa |
| 2013/0033836 A1 | 2/2013 | Hattori et al. |
| 2013/0083448 A1 | 4/2013 | Chung |
| 2013/0146347 A1 | 6/2013 | McConnell et al. |
| 2014/0055910 A1 | 2/2014 | Masuda et al. |
| 2014/0284089 A1 | 9/2014 | Hattori et al. |
| 2014/0312991 A1 | 10/2014 | Tan et al. |
| 2016/0219739 A1 | 7/2016 | Park et al. |

FOREIGN PATENT DOCUMENTS

| | | |
|---|---|---|
| JP | 2013-038144 A | 2/2013 |
| JP | 2014-207422 A | 10/2014 |

OTHER PUBLICATIONS

U.S. Non-final Office Action dated Jul. 10, 2018 issued in U.S. Appl. No. 15/065,521.

U.S. Final Office Action dated Nov. 17, 2017 issued in U.S. Appl. No. 15/065,521.

U.S. Non-final Office Action dated Jul. 25, 2017 issued in U.S. Appl. No. 15/065,521.

Office Action issued in corresponding Korean Patent Application No. 10-2015-0096169 dated Mar. 9, 2020, with English translation.

\* cited by examiner

LAMINATED ELECTRONIC COMPONENT AND CIRCUIT BOARD FOR MOUNTING THE SAME

CROSS-REFERENCE TO RELATED APPLICATION

This application is a Continuation patent application of U.S. patent application Ser. No. 15/065,521, filed on Mar. 9, 2016 which claims the benefit of priority to Korean Patent Application No. 10-2015-0096169, filed on Jul. 6, 2015 with the Korean Intellectual Property Office, the entirety of which is incorporated herein by reference.

TECHNICAL FIELD

The present disclosure relates to a laminated electronic component and a circuit board on which the laminated electronic component is mounted.

BACKGROUND

Electronic components formed of ceramic materials, such as capacitors, inductors, piezoelectric devices, varistors, or thermistors, include a ceramic body formed of ceramic materials, an internal electrode formed in the ceramic body, and an external electrode formed on a surface of the ceramic body and electrically connected to the internal electrode.

Among the ceramic electronic components, a laminated ceramic capacitor includes a plurality of laminated dielectric layers, internal electrodes disposed to oppose each other with one dielectric layer therebetween, and external electrodes electrically connected to the internal electrodes.

In a laminated electronic component in which two or more laminated ceramic capacitors are stacked, a volume increase irrelevant to a capacitance increase may occur during a process of stacking or bonding the laminated ceramic capacitors.

Furthermore, the level of equivalent series inductance (ESL) is an important characteristic in the laminated electronic component including the laminated ceramic capacitors. Electronic components having low ESL are desirable depending on the use thereof.

SUMMARY

An aspect of the present inventive concept provides a laminated electronic component capable of reducing a volume increase irrelevant to a capacitance increase and implementing low equivalent series inductance, and a mounting board mounting the laminated electronic component is also provided.

According to an aspect of the present inventive concept, a laminated electronic component includes a first capacitor and a second capacitor disposed on the first capacitor and electrically connected to the first capacitor. Internal electrodes and external electrodes of the first capacitor and the second capacitor may be disposed to form a current loop in a plane perpendicular to amounting surface when the laminated electronic component is mounted on a board.

According to another aspect of the present inventive concept, a mounting board mounting the laminated electronic component is provided.

BRIEF DESCRIPTION OF DRAWINGS

The above and other aspects, features, and advantages will be more clearly understood from the following detailed description taken in conjunction with the accompanying drawings, in which.

DETAILED DESCRIPTION

Figure 1:
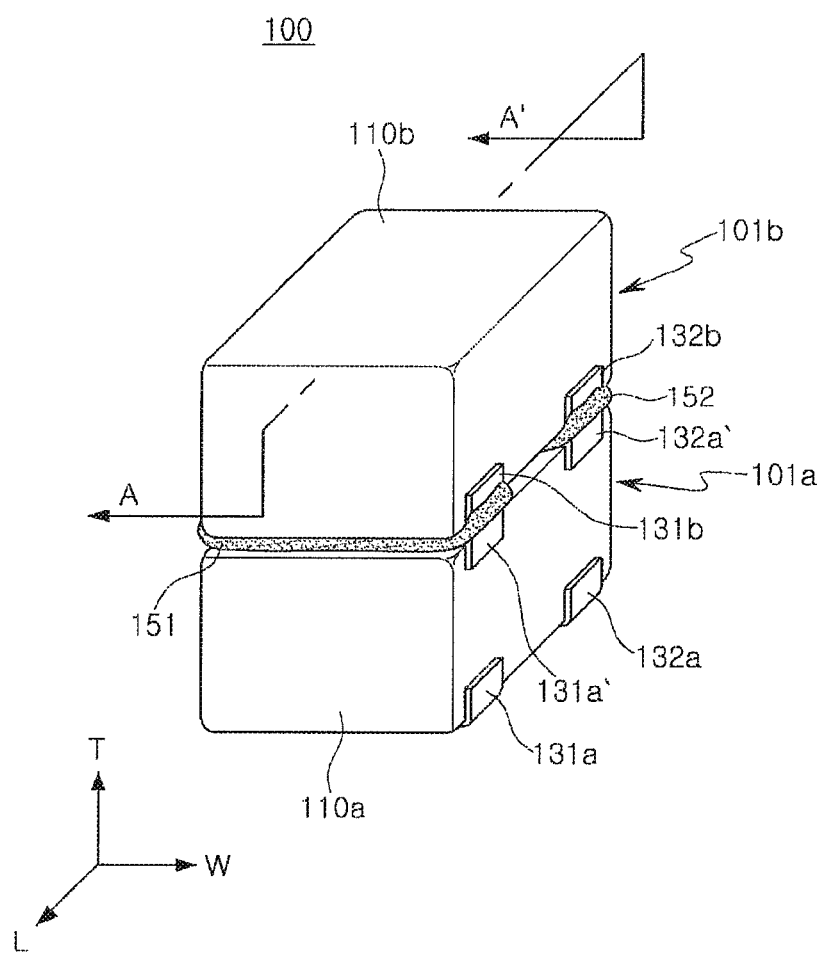
FIG. 1 is a perspective view schematically illustrating a laminated electronic component according to an exemplary embodiment of the present inventive concept.

Hereinafter, embodiments will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer, or section from another region, layer, or section. Thus, a first member, component, region, layer, or section discussed below could be termed a second member, component, region, layer, or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "upper," or "above" other elements would then be oriented "lower," or "below" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views illustrating embodiments. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

Laminated Electronic Component

A laminated electronic component according to an exemplary embodiment includes a first capacitor and a second capacitor arranged in a vertical direction.

The second capacitor is electrically connected to the first capacitor and disposed on the first capacitor.

According to the exemplary embodiment, the first capacitor and the second capacitor may be electrically connected through an upper surface of a first ceramic body and a lower surface of a second ceramic body to form a current loop in a plane perpendicular to a mounting surface of a board when the laminated electronic component is mounted on the board.

Therefore, a size of the current loop of the first and second capacitors included in the laminated electronic component may be reduced, and thus equivalent series inductance (ESL) of the first and second capacitors may be reduced. Thereby, the ESL of the laminated electronic component may be reduced.

The first capacitor and the second capacitor may be connected in series.

Hereinafter, exemplary embodiments will be described in detail with reference to the accompanying drawings, but the present inventive concept is not limited thereto.

Directions may be defined to clearly describe the exemplary embodiments. In the drawings, L, W, and T may respectively indicate length, width, and thickness directions of a ceramic body. Here, the thickness direction may be used as the same concept as a direction perpendicular to a mounting plane when the laminated electronic component is mounted on the board.

In addition, for convenience of description, surfaces opposing each other in a thickness direction of a ceramic body included in the laminated electronic component are defined as upper and lower surfaces.

Figure 2:
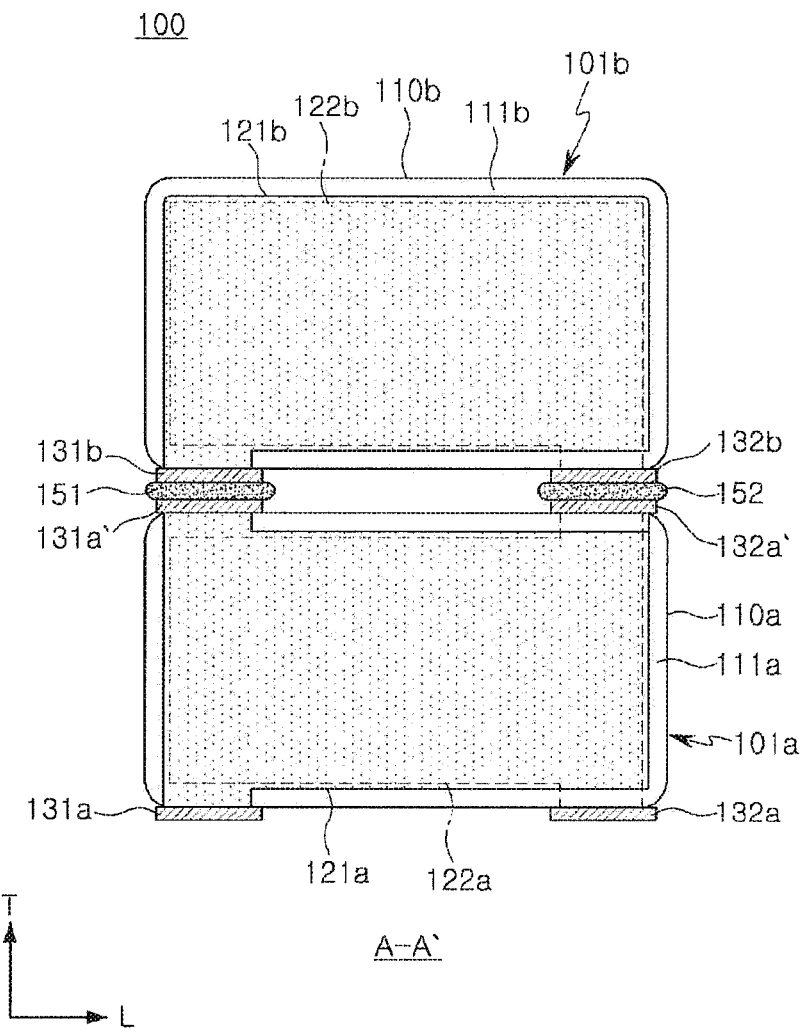
FIG. 2 is a cross-sectional view taken along line A-A' of FIG. 1.

FIG. 1 is a perspective view schematically illustrating a laminated electronic component according to an exemplary embodiment, and FIG. 2 is a cross-sectional view taken along line A-A' of FIG. 1.

Referring to FIGS. 1 and 2, a laminated electronic component 100 according to the exemplary embodiment includes a first capacitor 101a and a second capacitor 101b disposed on the first capacitor 101a.

The first capacitor 101a includes a first ceramic body 110a and first external electrodes 131a and 131a' and second external electrodes 132a and 132a'.

The first external electrodes 131a and 131a' include a lower-surface first external electrode 131a disposed on a lower surface of the first ceramic body 110a and an upper-surface first external electrode 131a' disposed on an upper surface of the first ceramic body 110a.

The second external electrodes 132a and 132a' include a lower-surface second external electrode 132a disposed on the lower surface of the first ceramic body 110a and an upper-surface second external electrode 132a' disposed on the upper surface of the first ceramic body 110a.

The second capacitor 101b includes a second ceramic body 110b and third and fourth external electrodes 131b and 132b. The third external electrode 131b is disposed on a lower surface of the second ceramic body 110b, and the fourth external electrode 132b is disposed on the lower surface of the second ceramic body 110b.

Figure 3:
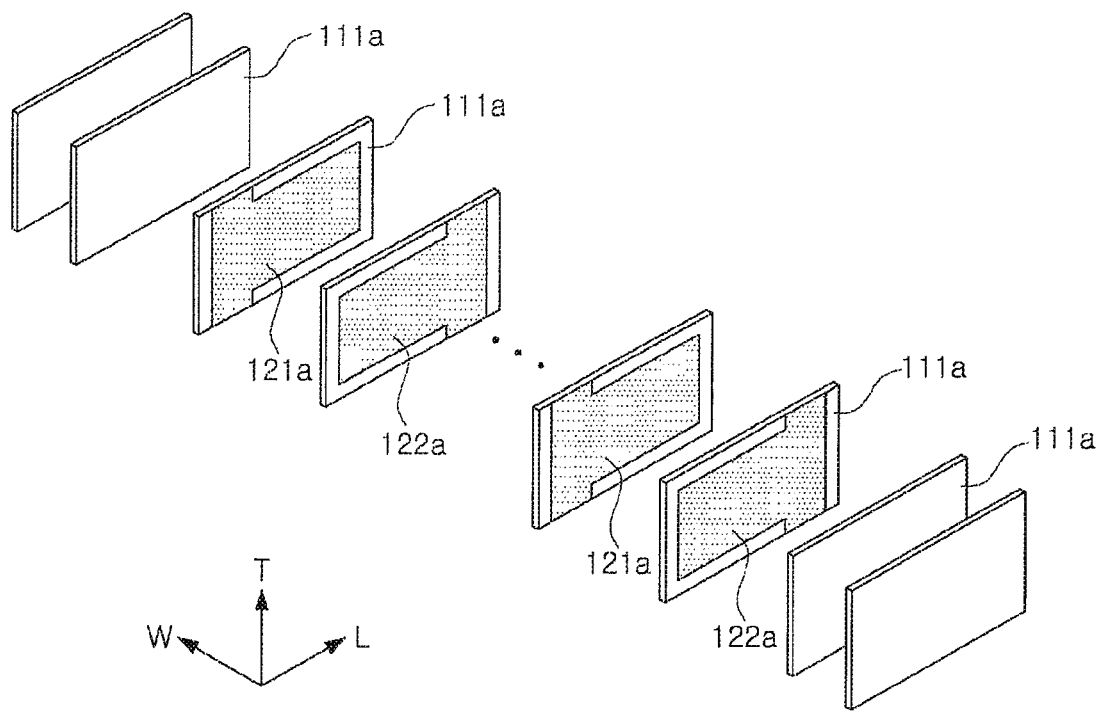
FIG. 3 is an exploded perspective view illustrating a first ceramic body of a first capacitor according to an exemplary embodiment of the present inventive concept.

FIG. 3 is an exploded perspective view illustrating a first ceramic body 110a of a first capacitor 101a according to an exemplary embodiment.

Referring to FIGS. 2 and 3, the first ceramic body 110a includes a first internal electrode 121a and a second internal electrode 122a, and the first and second internal electrodes 121a and 122a may be alternately disposed on a first dielectric layer 111a, with the first dielectric layer 111a disposed therebetween.

The first ceramic body 110a may be formed by stacking a plurality of first dielectric layers 111a and the first and second electrodes 121a and 122a, and sintering the stacked structure.

The first dielectric layers 111a may include a ceramic powder having a high dielectric constant, such as $BaTiO_3$-based powder or $SrTiO_3$-based powder, but the present inventive concept is not limited thereto.

The first and second internal electrodes 121a and 122a are electrodes having different polarities from each other, which may be formed by printing a conductive paste including a conductive metal on the first dielectric layers 111a at a predetermined thickness.

Here, the conductive metal included in the conductive paste may be, for example, nickel (Ni), copper (Cu), palladium (Pd), or alloys thereof, but the present inventive concept is not limited thereto.

In addition, the conductive paste may be printed by screen printing or gravure printing, for example, but the present inventive concept is not limited thereto.

The first and second internal electrodes 121a and 122a may be alternately stacked to oppose each other in a stacking direction of the first dielectric layers 111a in the first ceramic body 110a.

According to the exemplary embodiment, the first dielectric layers 111a may be stacked in the width direction of the first ceramic body 110a, and the first and second electrodes 121a and 122a may be disposed perpendicularly to upper and lower surfaces of the first ceramic body 110a.

According to the exemplary embodiment, the first and second electrodes 121a and 122a are drawn to the upper and lower surfaces of the first ceramic body 110a. That is, the first internal electrode 121a includes a first lead part drawn to the upper and lower surfaces of the first ceramic body 110a, and the second internal electrode 122a includes a second lead part drawn to the upper and lower surfaces of the first ceramic body 110a.

The first external electrodes 131a' and 131a of the first capacitor 101a are respectively disposed on the upper and lower surfaces of the first ceramic body 110a to be connected to the first internal electrode 121a drawn to the upper and lower surfaces of the first ceramic body 110a, and the second external electrodes 132a' and 132a of the first capacitor 101a are respectively disposed apart from the first external electrodes 131a' and 131a on the upper and lower surfaces of the first ceramic body to be connected to the second internal electrode 122a drawn to the upper and lower surfaces of the first ceramic body 110a.

Figure 4:
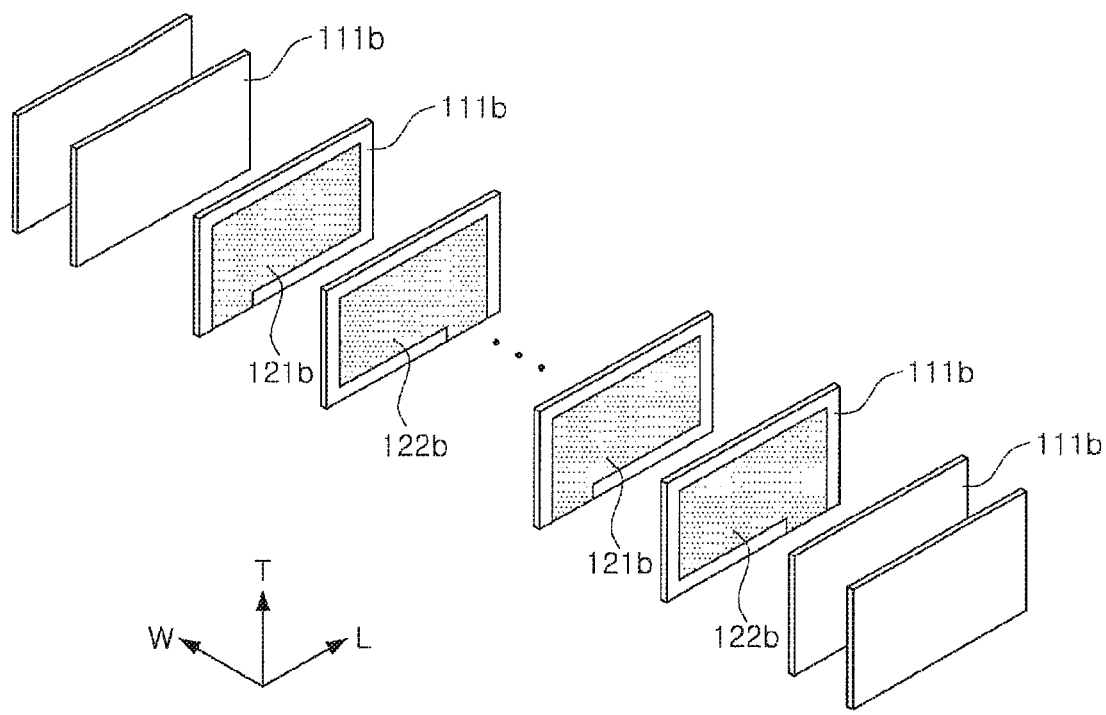
FIG. 4 is an exploded perspective view of a second ceramic body of a second capacitor according to an exemplary embodiment of the present inventive concept.

FIG. 4 is an exploded perspective view of a second ceramic body 110b of a second capacitor 101b according to an exemplary embodiment.

Referring to FIGS. 2 and 4, the second ceramic body 110b includes a third internal electrode 121b and a fourth internal electrode 122b, and the third and fourth internal electrodes 121b and 122b may be alternately disposed on a second dielectric layer 111b with the second dielectric layer 111b therebetween.

The second ceramic body 110b may be formed by stacking a plurality of second dielectric layers 111b and the third and fourth internal electrodes 121b and 122b, and sintering the stacked structure.

The second dielectric layers 111b may be formed of the same material as or a different dielectric material from the above-described first dielectric layers 111a, but the present inventive concept is not limited thereto.

The third and fourth internal electrodes 121b and 122b are electrodes having different polarities from each other, which may be formed by printing a conductive paste including a conductive metal on the second dielectric layers 111b at a predetermined thickness. The third and fourth internal electrodes 121b and 122b may be formed by a similar method to the above-described first and second electrodes 121a and 122a, but the present inventive concept is not limited thereto.

The third and fourth internal electrodes 121b and 122b may be alternately stacked to oppose each other in a stacking direction of the second dielectric layers 111b in the second ceramic body 110b.

According to the exemplary embodiment, the second dielectric layer 111b may be stacked in the width direction of the second ceramic body 110b, and the third and fourth internal electrodes 121b and 122b may be disposed perpendicularly to upper and lower surfaces of the second ceramic body 110b.

According to the exemplary embodiment, the third and fourth internal electrodes 121b and 122b are drawn to the lower surface of the second ceramic body 110b. That is, the third internal electrode 121b includes a third lead part drawn to the lower surface of the second ceramic body 110b, and the fourth internal electrode 122b includes a fourth lead part drawn to the lower surface of the second ceramic body 110b.

The third external electrode 131b of the second capacitor 101b is disposed on the lower surface of the second ceramic body 110b to be connected to the third internal electrode 121b drawn to the lower surface of the second ceramic body 110b, and the fourth external electrode 132b of the second capacitor 101b is disposed apart from the third external electrode 131b on the lower surface of the second ceramic body 110b and connected to the fourth internal electrode 122b drawn to the lower surface of the second ceramic body 110b.

According to the exemplary embodiment, since the external electrodes 131a, 131a', 132a, 132a', 131b, and 132b of the first and second capacitors 101a and 101b are disposed on the upper surface or the lower surface of the first and second ceramic bodies 110a and 110b, a chip size against a capacity of the electronic component may be decreased due to reduced areas of the external electrodes 131a, 131a', 132a, 132a', 131b, and 132b. Alternatively, the capacity against the chip size of the electronic component may be increased.

In addition, a volume increase of a laminated electronic component regardless of a capacitance increase thereof may be reduced, compared to a case in which the external electrodes 131a, 131a', 132a, 132a', 131b, and 132b of the first and second capacitors 101a and 101b are disposed on side surfaces of the ceramic bodies 110a and 110b.

The first to fourth external electrodes 131a, 131a', 132a, 132a', 131b, and 132b of the first and second capacitors 101a and 101b may extend to both side surfaces in the width direction from the upper and lower surfaces of the ceramic bodies 110a and 110b.

The first to fourth external electrodes 131a, 131a', 132a, 132a', 131b, and 132b of the first and second capacitors 101a and 101b may be formed of a conductive paste including a conductive metal.

Here, the conductive metal may be, for example, nickel (Ni), copper (Cu), palladium (Pd), gold (Au), or alloys thereof, but the present inventive concept is not limited thereto.

According to the exemplary embodiment, the upper-surface first external electrode 131a' of the first capacitor 101a may be electrically connected to the third external electrode 131b of the second capacitor 101b, and the upper-surface second external electrode 132a' of the first capacitor 101a may be electrically connected to the fourth external electrode 132b of the second capacitor 101b.

The upper-surface first external electrode 131a' of the first capacitor 101a and the upper-surface second external electrode 132a' of the first capacitor 101a may be attached and electrically connected to the third external electrode 131b of the second capacitor 101b and the fourth external electrode 132b of the second capacitor 101b, respectively, by conductive adhesives 151 and 152.

The conductive adhesives 151 and 152 may be solders, but are not limited thereto.

Alternatively, the conductive adhesives 151 and 152 may include conductive particles and a base resin.

The conductive particles may be, but are not limited to, silver (Ag) particles, and the base resin may be a thermosetting resin such as an epoxy resin. In addition, the conductive adhesives 151 and 152 may include copper (Cu) as the conductive metal, but is not limited thereto.

An external voltage may be applied to the laminated electronic component via the lower-surface first external electrode 131a and lower-surface second external electrode 132a disposed on the lower surface of the first ceramic body 110a, among the external electrodes 131a, 131a', 132a, and 132a' of the first capacitor 101a.

In addition, a voltage applied to the first capacitor 101a may be transferred to the second capacitor 101b via the upper-surface first external electrode 131a' and upper-surface second external electrode 132a' disposed on the upper surface of the first ceramic body 110a, among the external electrodes 131a, 131a', 132a, and 132a' of the first capacitor 101a.

The second capacitor 101b may receive the voltage transferred from the first capacitor 101a via the third external electrode 131b and fourth external electrode 132b disposed on the lower surface of the second ceramic body 110b of the second capacitor 101b.

In this manner, when the laminated electronic component is mounted on a board, a current loop of the laminated electronic component may be formed in a plane perpendicular to a mounting surface of the board. Accordingly, the size of the current loop formed in the laminated electronic component may be reduced, thus reducing the ESL of the laminated electronic component.

Mounting Board of Laminated Electronic Component

Figure 5:
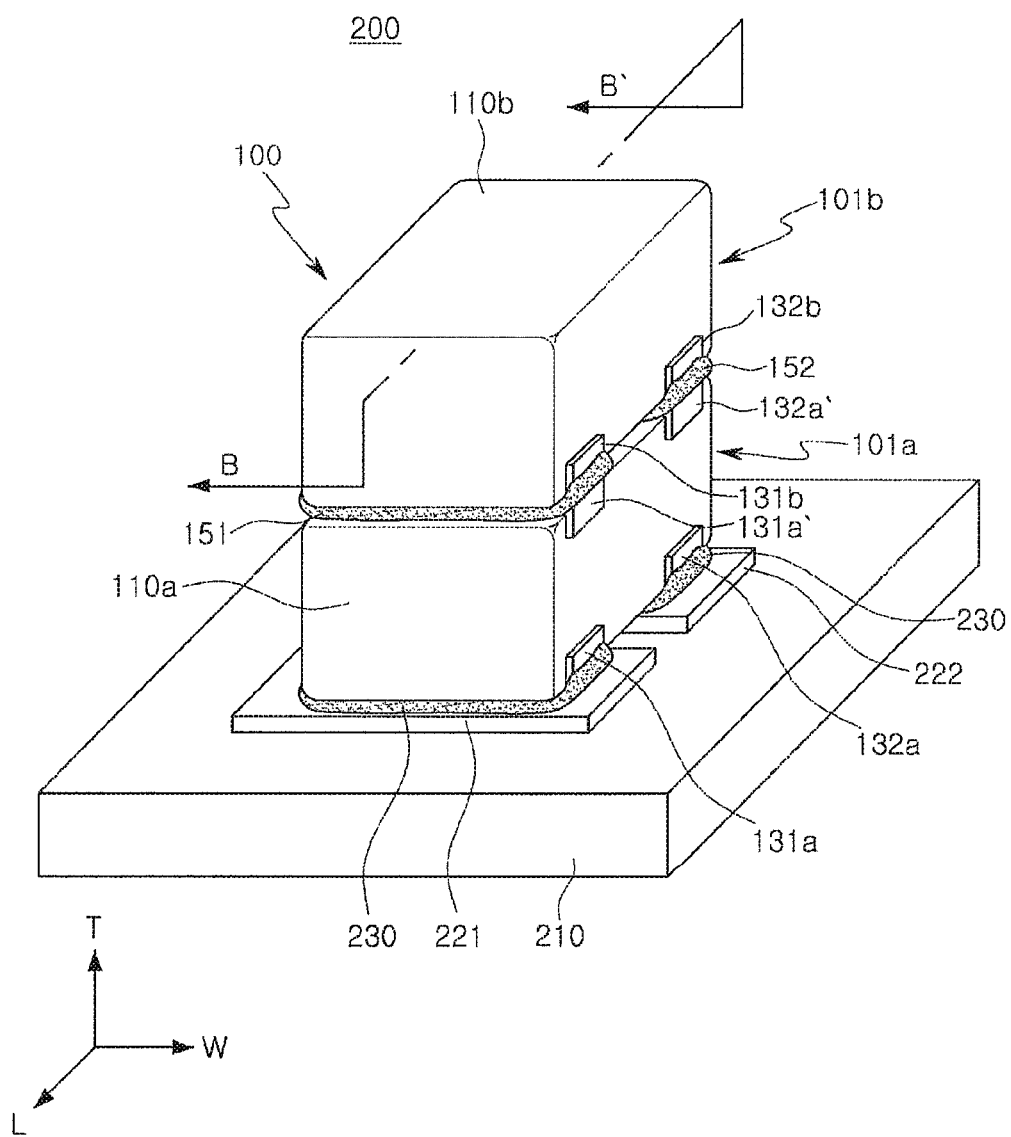
FIG. 5 is a perspective view of a laminated electronic component mounted on a printed circuit board according to an exemplary embodiment of the present inventive concept.
Figure 6:
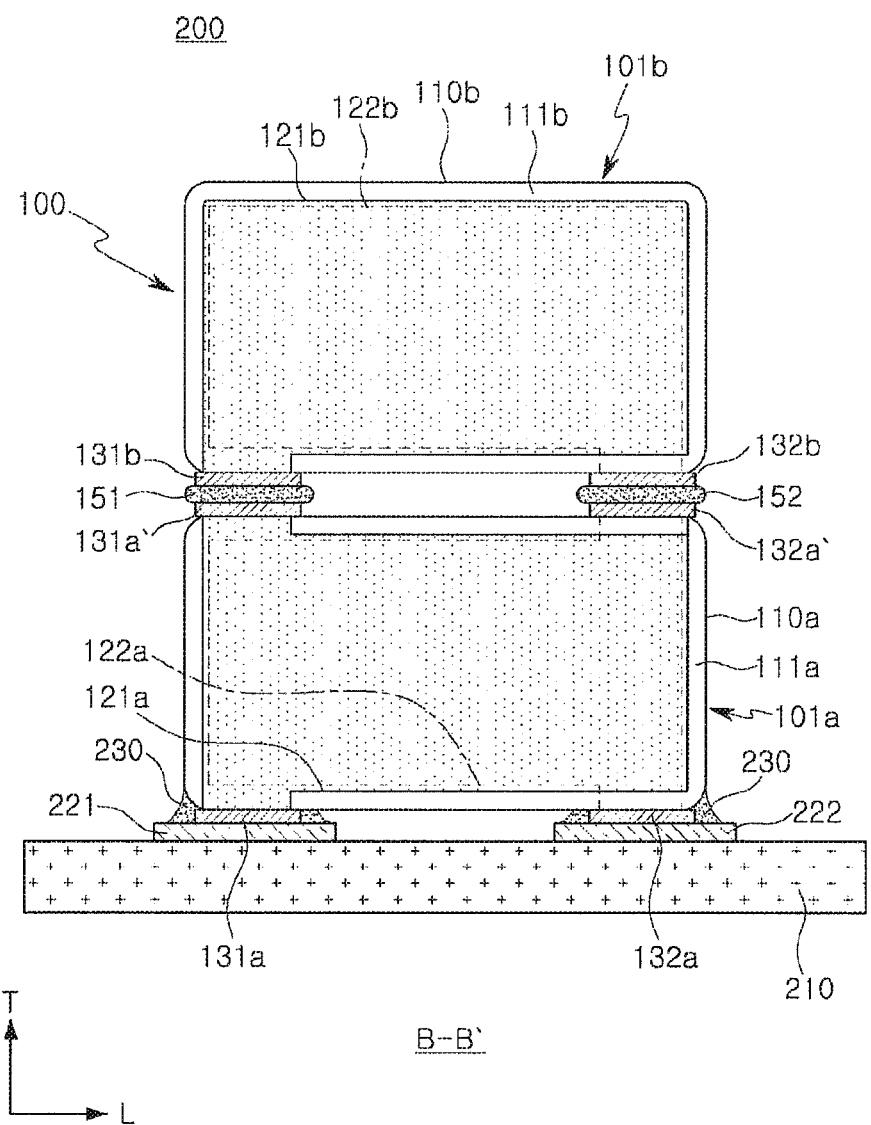
FIG. 6 is a cross-sectional view taken along line B-B' of FIG. 5.

FIG. 5 is a perspective view of a laminated electronic component mounted on a printed circuit board according to an exemplary embodiment, and FIG. 6 is a cross-sectional view taken along line B-B' of FIG. 5.

Referring to FIGS. 5 and 6, a mounting board 200 mounting a laminated electronic component according to another exemplary embodiment includes a printed circuit board 210 on which electrode pads 221 and 222 are disposed, a laminated electronic component 100 mounted on the printed circuit board 210, and a solder 230 connecting the electrode pads 221 and 222 to the laminated electronic component 100.

The mounting board 200 mounting the laminated electronic component according to the exemplary embodiment includes the printed circuit board 210 on which the laminated electronic component 100 is mounted, and two or more electrode pads 221 and 222 formed on an upper surface of the printed circuit board 210.

The electrode pads 221 and 222 may include first and second electrode pads 221 and 222, and the first electrode pad 221 may be connected to a lower-surface first external electrode 131a of a first capacitor 101a disposed at a lower part of the laminated electronic component 100, and the second electrode pad 222 may be connected to a lower-surface second external electrode 132a of the first capacitor 101a.

Here, the lower-surface first external electrode 131a and the lower-surface second external electrode 132a may be respectively disposed on the first and second electrode pads 221 and 222 to be in contact therewith, and electrically connected to the printed circuit board 210 by the solder 230.

Figure 7:
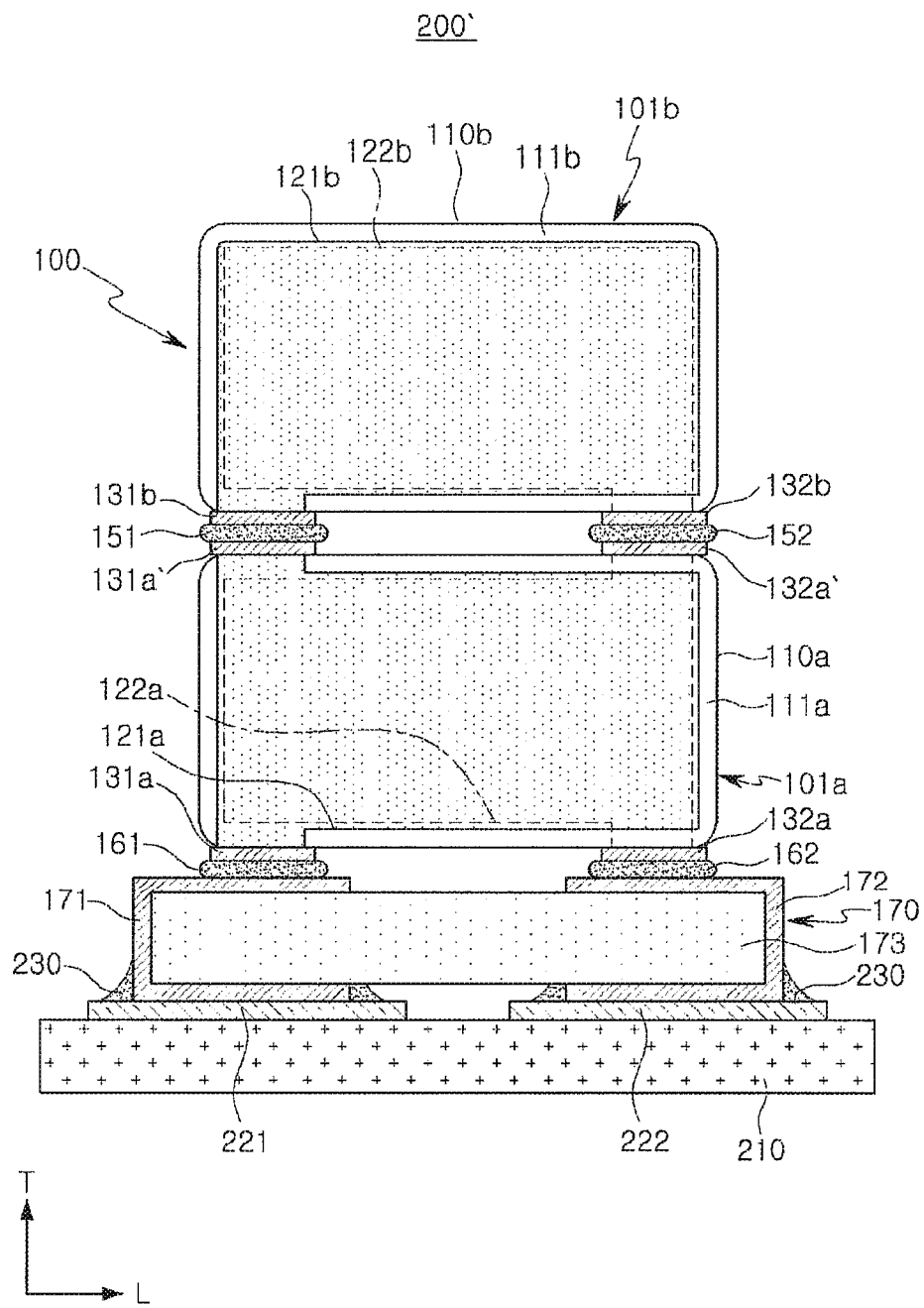
FIG. 7 is a cross-sectional view of a mounting board mounting a laminated electronic component according to a modified embodiment of the present inventive concept.

FIG. 7 is a cross-sectional view of a mounting board mounting a laminated electronic component according to a modified embodiment of the present inventive concept.

The mounting board 200' mounting the laminated electronic component according to the modified embodiment may further include a ceramic substrate 170 disposed between a laminated electronic component 100 and a printed circuit board 210.

The ceramic substrate 170 may include an insulating body 173 and first and second conductive layers 171 and 172 formed on an outer surface of the insulating body 173. The first conductive layer 171 may be connected to a lower-surface first external electrode 131a of a first capacitor 101a and a first electrode pad 221 of the printed circuit board 210, and the second conductive layer 172 may be connected to a lower-surface second external electrode 132a of the first capacitor 101a and a second electrode pad 222 of the printed circuit board 210.

The first conductive layer 171 may extend from one surface in the length direction of the insulating body 173 to an upper surface and a lower surface of the insulating body 173, and the second conductive layer 172 may extend from the other surface in the length direction of the insulating body 173 to the upper surface and the lower surface of the insulating body 173. However, the present inventive concept is not limited thereto.

Electronic components having piezoelectric and electrostrictive characteristics may generate acoustic noise when they are mounted on a board. The laminated electronic component 100 according to the exemplary embodiment may also generate acoustic noise when it is directly mounted on a board.

According to the modified embodiment, the laminated electronic component 100 is not directly mounted on the printed circuit board 210, but mounted on the printed circuit board 210 with the ceramic substrate 170 interposed therebetween, thus reducing acoustic noise generated by the laminated electronic component.

The lower-surface first external electrode 131a of the first capacitor 101a and the lower-surface second external electrode 132a of the first capacitor 101a may be attached and electrically connected to the first conductive layer 171 of the ceramic substrate 170 and the second conductive layer 172 of the ceramic substrate 170, respectively, by conductive adhesives 161 and 162.

The conductive adhesives 161 and 162 may be solders, but are not limited thereto.

Alternatively, the conductive adhesives 161 and 162 may include conductive particles and a base resin.

The conductive particles may be, but are not limited to, silver (Ag) particles, and the base resin may be a thermosetting resin such as an epoxy resin. In addition, the conductive adhesives 161 and 162 may include copper (Cu) as the conductive metal, but is not limited thereto.

Figure 8:
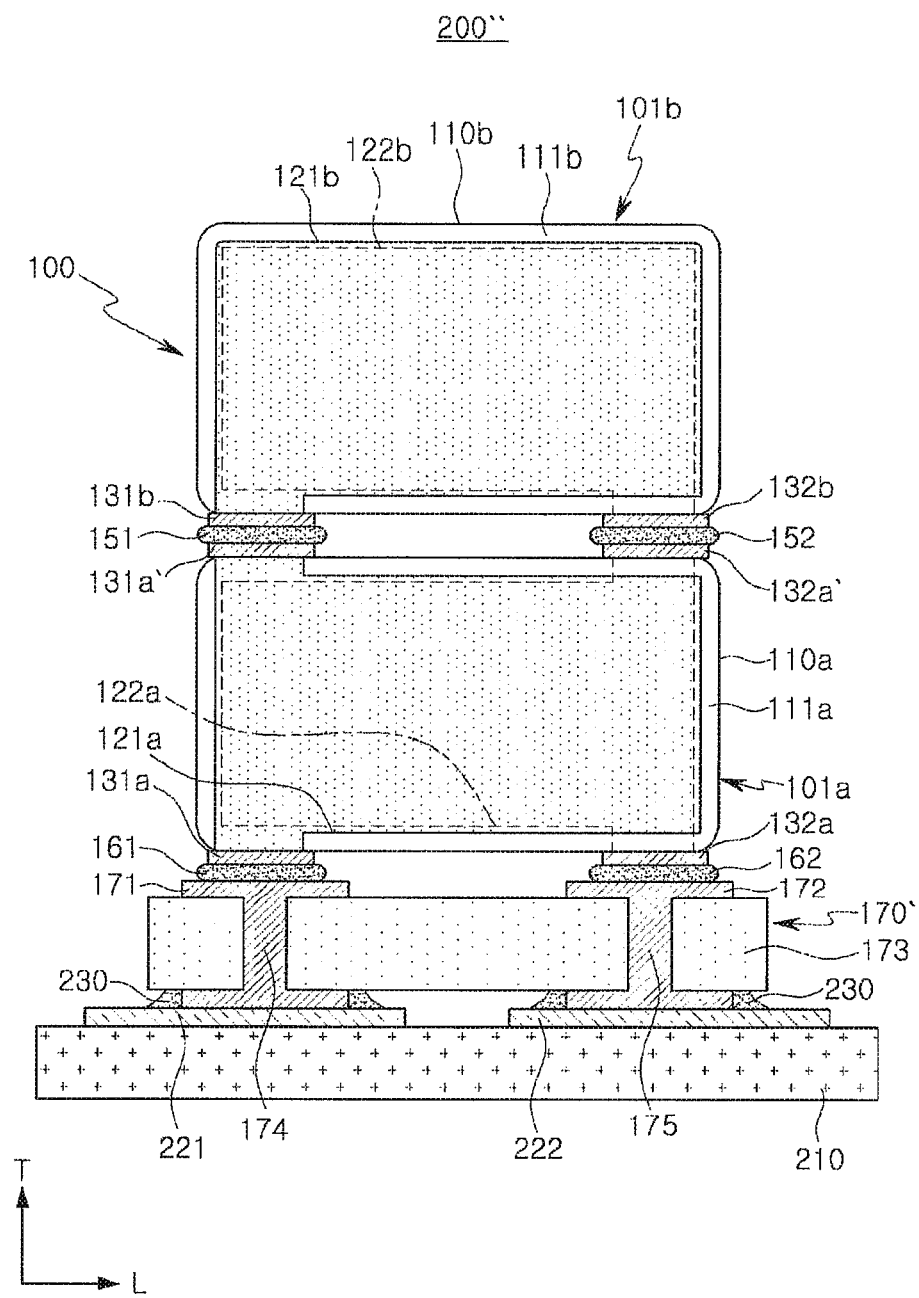
FIG. 8 is a cross-sectional view of a mounting board mounting a laminated electronic component according to another modified embodiment of the present inventive concept.

FIG. 8 is a cross-sectional view of a mounting board mounting a laminated electronic component according to another modified embodiment of the present inventive concept.

According to a modified example, a mounting board 200" mounting a laminated electronic component may further include conductive vias 174 and 175 passing through the insulating body 173 of the ceramic substrate 170' in addition to the configuration of the mounting board 200' of the modified example of FIG. 7.

For example, as illustrated in FIG. 8, a ceramic substrate 170' disposed between the laminated electronic component 100 and the printed circuit board 210 may include a first conductive via 174 connecting a portion of the first conductive layer 171 extending to an upper surface of the insulating body 173 to a portion of the first conductive layer 171 extending to a lower surface of the insulating body 173, and passing through the insulating body 173, and a second conductive via 175 connecting a portion of the second conductive layer 172 extending to the upper surface of the insulating body 173 to a portion of the second conductive layer 172 extending to the lower surface of the insulating body 173.

As shown in the modified embodiment illustrated in FIG. 7, a ceramic substrate may be disposed between a laminated electronic component and a printed circuit board. Acoustic noise generated by the laminated electronic component may be reduced, but ESL may increase because a voltage applied via an electrode pad of the printed circuit board is applied to the laminated electronic component via the ceramic substrate.

When a conductive via passes through an insulating body of a ceramic substrate as in the modified exemplary embodiment illustrated in FIG. 8, however, the increase in the ESL may be reduced.

As set forth above, according to the exemplary embodiment, a laminated electronic component capable of reducing a volume increase irrelevant to a capacitance increase and implementing low ESL, and a mounting board mounting the laminated electronic component, may be provided.

While exemplary embodiments have been shown and described above, it will be apparent to those skilled in the art that modifications and variations could be made without departing from the scope of the invention as defined by the appended claims.

What is claimed is:

1. A laminated electronic component, comprising:
a first capacitor including a first ceramic body, first external electrodes disposed on upper and lower surfaces of the first ceramic body, and second external electrodes disposed apart from the first external electrodes on the upper and lower surfaces of the first ceramic body; and
a second capacitor including a second ceramic body, a third external electrode disposed on a lower surface of the second ceramic body, and a fourth external electrode disposed apart from the third external electrode on the lower surface of the second ceramic body, the second capacitor being disposed on the first capacitor in a stacking direction and electrically connected to the first capacitor,
wherein a current loop passing through the upper surface of the first ceramic body and the lower surface of the second ceramic body is formed,
a plurality of internal electrodes of the first and second capacitors are disposed to be perpendicular to the lower surfaces of the first and second ceramic bodies,
each of the plurality of internal electrodes of the first capacitor is disposed on the same plane with one of the plurality of internal electrodes of the second capacitor,
the pluralities of internal electrodes of the first and second capacitors disposed on the same plane are electrically connected,
each of the pluralities of internal electrodes of the first and second capacitors includes a plurality of first internal electrodes and a plurality of second internal electrodes,
each of the plurality of first internal electrodes and each of the plurality of second internal electrodes of each of the first and second capacitors are respectively spaced apart from end surfaces of each of the first and second ceramic bodies in a length direction,
in a stacked combination of the first and second capacitors, portions of the first to fourth external electrodes, that are disposed between the first and second capacitors, are respectively disposed on the upper surface of the first ceramic body and the lower surface of the second ceramic body in the stacking direction, and the first to fourth external electrodes are not arranged on the end surfaces of the first and second ceramic bodies in the length direction, and
each of the plurality of internal electrodes of the first capacitor is exposed to the upper surface of the first ceramic body, and each of the plurality of internal electrodes of the second capacitor is exposed to the lower surface of the second ceramic body.

2. The laminated electronic component of claim 1, wherein the current loop is formed in a plane perpendicular to a mounting surface when the laminated electronic component is mounted on a board.

3. The laminated electronic component of claim 1, wherein the first capacitor and the second capacitor are connected in series.

4. The laminated electronic component of claim 1, wherein the first external electrode on the upper surface of the first ceramic body is electrically connected to the third external electrode, and the second external electrode on the upper surface of the first ceramic body is electrically connected to the fourth external electrode.

5. The laminated electronic component of claim 4, wherein the first and second external electrodes are electrically connected to the third and fourth external electrodes, respectively, by a conductive adhesive.

6. The laminated electronic component of claim 1, wherein the first ceramic body comprises:
a first internal electrode drawn to the upper and lower surfaces of the first ceramic body to be connected to the first external electrodes; and
a second internal electrode overlapping the first internal electrode to form capacitance, and drawn to the upper and lower surfaces of the first ceramic body to be connected to the second external electrodes.

7. The laminated electronic component of claim 6, wherein the first and second internal electrodes are disposed to be perpendicular to the lower surface of the first ceramic body.

8. The laminated electronic component of claim 1, wherein the second ceramic body comprises:
a third internal electrode drawn to the lower surface of the second ceramic body to be connected to the third external electrode; and
a fourth internal electrode overlapping the third internal electrode to form capacitance, and drawn to the lower surface of the second ceramic body to be connected to the fourth external electrode.

9. The laminated electronic component of claim 8, wherein the third and fourth internal electrodes are disposed to be perpendicular to the lower surface of the second ceramic body.

10. The laminated electronic component of claim 1, wherein the first to fourth external electrodes each are spaced apart from the end surfaces of each of the first and second ceramic bodies by a predetermined distance in the length direction.

11. A mounting board mounting a laminated electronic component, comprising:
a printed circuit board including first and second electrode pads disposed thereon;
a laminated electronic component mounted on the printed circuit board; and
a solder connecting the first and second electrode pads to the laminated electronic component,
wherein the laminated electronic component comprises:
a first capacitor including a first ceramic body, first external electrodes disposed on upper and lower surfaces of the first ceramic body, and second external electrodes disposed apart from the first external electrodes on the upper and lower surfaces of the first ceramic body; and
a second capacitor including a second ceramic body, a third external electrode disposed on a lower surface of the second ceramic body, and a fourth external electrode disposed apart from the third external electrode on the lower surface of the second ceramic body, the second capacitor being disposed on the first capacitor in a stacking direction and electrically connected to the first capacitor,
wherein a current loop passing through the upper surface of the first ceramic body and the lower surface of the second ceramic body is formed,
a plurality of internal electrodes of the first and second capacitors are arranged perpendicular to the lower surfaces of the first and second ceramic bodies, each of the plurality of internal electrodes of the first capacitor is disposed on the same plane with one of the plurality of internal electrodes of the second capacitor, the pluralities of internal electrodes of the first and second capacitors disposed on the same plane are electrically connected, each of the pluralities of internal electrodes of the first and second capacitors includes a plurality of first internal electrodes and a plurality of second internal electrodes, each of the plurality of first internal electrodes and each of the plurality of second internal electrodes of each of the first and second capacitors are respectively spaced apart from end surfaces of each of the first and second ceramic bodies in a length direction, in a stacked combination of the first and second capacitors, portions of the first to fourth external electrodes, that are disposed between the first and second capacitors, are respectively disposed on the upper surface of the first ceramic body and the lower surface of the second ceramic body in the stacking direction, and the first to fourth external electrodes are not arranged on the end surfaces of the first and second ceramic bodies in the length direction, and each of the plurality of internal electrodes of the first capacitor is exposed to the upper surface of the first ceramic body, and each of the plurality of internal electrodes of the second capacitor is exposed to the lower surface of the second ceramic body.

12. The mounting board mounting a laminated electronic component of claim 11, further comprising a ceramic substrate disposed between the laminated electronic component and the printed circuit board.

13. The mounting board mounting a laminated electronic component of claim 12, wherein the ceramic substrate includes an insulating body, and first and second conductive layers formed on an outer surface of the insulating body, the first conductive layer is connected to the first external electrode on the lower surface of the first capacitor and the first electrode pad of the printed circuit board, and the second conductive layer is connected to the second external electrode on the lower surface of the first capacitor and the second electrode pad of the printed circuit board.

14. The mounting board mounting a laminated electronic component of claim 13, wherein the first conductive layer extends from one surface in a length direction of the insulating body to upper and lower surfaces of the insulating body, and the second conductive layer extends from the other surface in the length direction of the insulating body to the upper and lower surfaces of the insulating body.

15. The mounting board mounting a laminated electronic component of claim 13, wherein the ceramic substrate comprises:

a first conductive via connecting a portion of the first conductive layer disposed on the upper surface of the insulating body to a portion of the first conductive layer disposed on the lower surface of the insulating body and passing through the insulating body, and a second conductive via connecting a portion of the second conductive layer disposed on the upper surface of the insulating body to a portion of the second conductive layer disposed on the lower surface of the insulating body and passing through the insulating body.

16. The mounting board mounting a laminated electronic component of claim 13, wherein the first and second external electrodes are electrically connected to the first and second conductive layers, respectively, by a conductive adhesive.

17. The mounting board mounting a laminated electronic component of claim 11, wherein the current loop is formed in a plane perpendicular to a mounting surface of the printed circuit board.

18. The mounting board mounting a laminated electronic component of claim 11, wherein the first capacitor and the second capacitor are connected in series.

19. The laminated electronic component of claim 11, wherein the first to fourth external electrodes each are spaced apart from the end surfaces of each of the first and second ceramic bodies by a predetermined distance in the length direction.

* * * * *

UNITED STATES PATENT AND TRADEMARK OFFICE
CERTIFICATE OF CORRECTION

PATENT NO. : 10,714,265 B2
APPLICATION NO. : 16/267678
DATED : July 14, 2020
INVENTOR(S) : Soo Hwan Son et al.

It is certified that error appears in the above-identified patent and that said Letters Patent is hereby corrected as shown below:

On the Title Page

Item (73), should read as follows:
(73) Assignee: SAMSUNG ELECTRO-MECHANICS CO., LTD., Suwon-si, Gyeonggi-do (KR)

Signed and Sealed this
Fifth Day of July, 2022

Katherine Kelly Vidal
*Director of the United States Patent and Trademark Office*